United States Patent [19]

Horiuchi

[11] Patent Number: 5,473,760
[45] Date of Patent: Dec. 5, 1995

[54] DEVICE AND METHOD FOR INTERFACE EFFECTIVE/INEFFECTIVE STATE JUDGING BY VARYING THRESHOLD VOLTAGE TO AN INPUT RECEIVER CIRCUIT

[75] Inventor: Nobuhiro Horiuchi, Osaka, Japan

[73] Assignee: Mita Industrial Co., Ltd., Osaka, Japan

[21] Appl. No.: 130,553

[22] Filed: Oct. 1, 1993

[30] Foreign Application Priority Data

Oct. 13, 1992 [JP] Japan .................................. 4-274442

[51] Int. Cl.⁶ .......................... G06F 9/00; G06F 11/00; G06F 11/22
[52] U.S. Cl. .......................... 395/835; 364/DIG. 1; 364/239.9; 364/267; 364/267.4; 364/DIG. 2; 364/943.9; 364/944.7; 364/944.9; 395/837; 395/185.01
[58] Field of Search .................................. 395/275, 325, 395/575; 307/62; 341/50, 53

[56] References Cited

U.S. PATENT DOCUMENTS

| 4,603,320 | 7/1986 | Farago | 341/189 |
|---|---|---|---|
| 4,631,698 | 12/1986 | Walsh et al. | 395/275 |
| 4,884,287 | 11/1989 | Jones et al. | 375/377 |
| 5,097,213 | 3/1992 | Hunting et al. | 324/538 |
| 5,157,769 | 10/1992 | Eppley et al. | 395/275 |
| 5,264,958 | 11/1993 | Johnson | 395/325 |

Primary Examiner—Thomas C. Lee
Assistant Examiner—D. Dinh
Attorney, Agent, or Firm—Beveridge, DeGrandi Weilacher & Young

[57] ABSTRACT

The level of an input signal to an interface is judged at a first threshold value and a second threshold value. The first threshold value and the second threshold value are values within the amplitude range of the input signal. The first threshold value is higher than the input signal in a case where the interface is an ineffective state. The second threshold value is lower than the input signal in a case where the interface is in the ineffective state. If the interface is in the ineffective state, therefore, the result of the judgment of the level of the input signal at the first threshold value and the result of the judgment of the level of the input signal at the second threshold value differ from each other. It is judged whether the interface is in an effective state or in the ineffective state depending on whether or not the results differ from each other.

19 Claims, 5 Drawing Sheets

FIG. 3

# DEVICE AND METHOD FOR INTERFACE EFFECTIVE/INEFFECTIVE STATE JUDGING BY VARYING THRESHOLD VOLTAGE TO AN INPUT RECEIVER CIRCUIT

BACKGROUND OF THE INVENTION

1. Field of the Invention

The present invention relates to an interface effective/ineffective state judging device and method suitably used in a computer, a printer or the like equipped with an interface such as an RS-232C (ANSI/EIA 232-D) interface.

2. Description of the Related Art

A printer widely used as an output device of a personal computer or a word processor is equipped with an RS-232C interface which is a serial interface and a Centronics interface which is a parallel interface as a host interface for data communication with a host. Either one of the two interfaces is generally selected and used by switching using software from the host or a switching operation in an operation section in the printer.

For example, when data communication is established between the host computer and the printer via the RS-232C interface, the printer and the host computer are connected to each other by a dedicated communication cable. In addition, the operation section in the printer is operated, to select the RS-232C interface.

For example, when a user forgets to connect the cable, the cable is incompletely connected, or the connection between connectors is interrupted after the cable is connected, data communication cannot be established between the host computer and the printer.

In the prior art, however, there was no means for determining whether the interface is in an effective state where data communication can be established or in an ineffective state where data communication cannot be established. Therefore, the user may, in some cases, meaninglessly wait for output by uselessly sending data from the host computer to the printer.

SUMMARY OF THE INVENTION

An object of the present invention is to provide an interface effective/ineffective state judging device capable of judging whether or not an interface is in a state where data communication via the interface is effectively established.

Another object of the present invention is to provide an interface effective/ineffective state judging method in which it can be judged whether or not an interface is in a state where data communication via the interface is effectively established.

In the present invention, it is judged whether or not a predetermined interface is in an effective state where data communication via the interface can be effectively established or in an ineffective state where data communication via the interface cannot be effectively established. Specifically, the level of an input signal externally inputted to the predetermined interface is judged at a first threshold value and a second threshold value in the amplitude range of the input signal. The first threshold value is higher than the input signal in a case where the interface is in the ineffective state, and the second threshold value is lower than the input signal in a case where the interface is in the ineffective state.

If the interface is in the ineffective state, therefore, the result of the judgment of the level of the input signal at the first threshold value and the result of the judgment of the level of the input signal at the second threshold value differ from each other. On the other hand, if the interface is in the effective state, the result of the judgment of the level of the input signal at the first threshold value and the result of the judgment of the level of the input signal at the second threshold value are equal to each other. The reason for this is that both the first threshold value and the second threshold value are values in the amplitude range of the input signal.

It is thus judged whether the interface is in the effective state or in the ineffective state.

If the present invention is applied to data communication, therefore, it is possible to inform a user that the interface is in the ineffective state. Consequently, in an apparatus for establishing data communication, it is possible to effectively avoid the situation where the user misunderstands that data communication is effectively established irrespective of the fact that the interface is in the ineffective state.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 4 (a) to 4 (k) are timing charts for explaining the operation of the above described judging circuit; and FIGS. 5(a) to 5(d) are timing charts for explaining the relationship between an input signal and the on/off timing of an analog switch.

DESCRIPTION OF PREFERRED EMBODIMENTS

Figure 1:
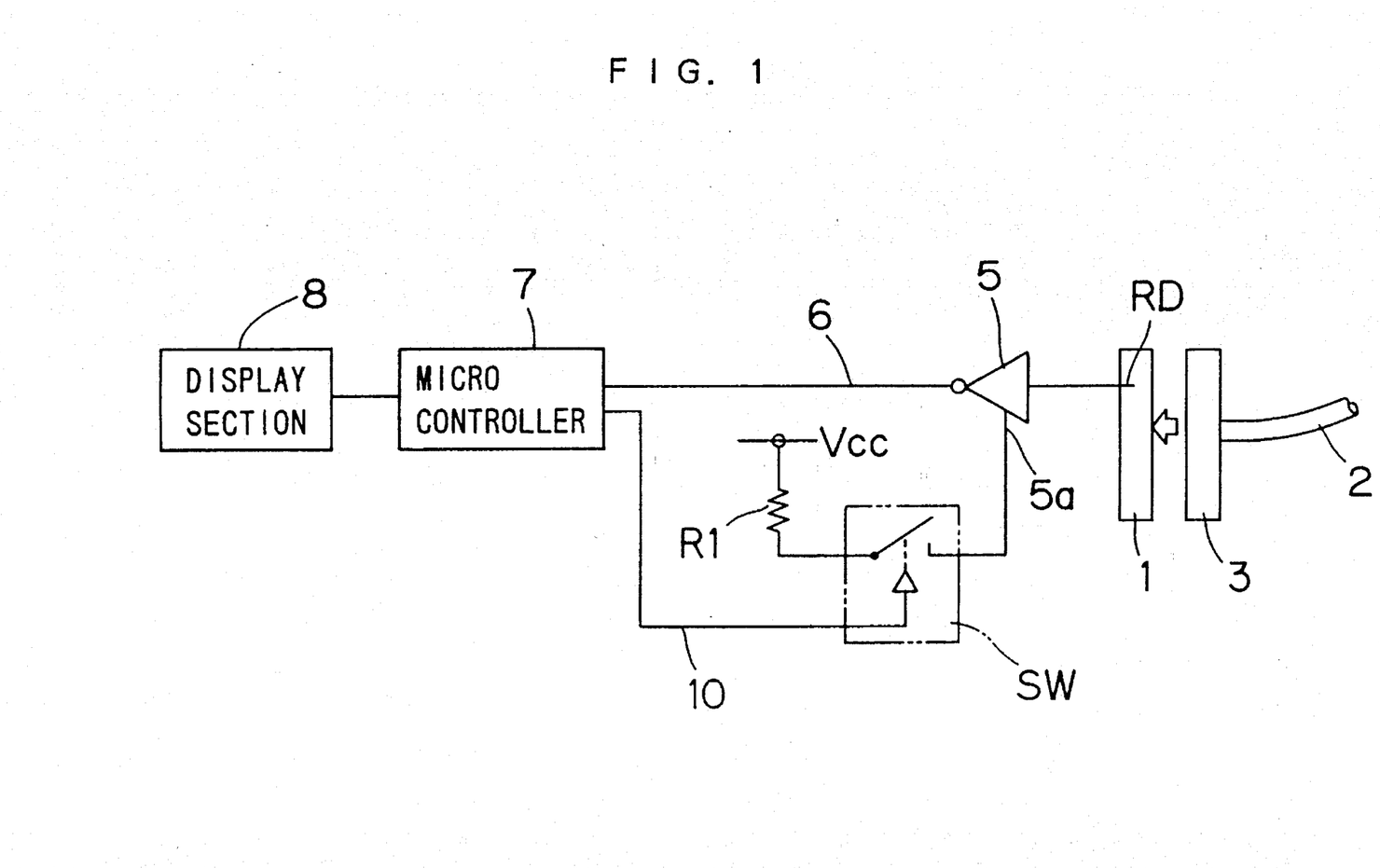
FIG. 1 is a block diagram showing the construction of an interface effective/ineffective state judging device according to one embodiment of the present invention.

FIG. 1 is a block diagram showing the construction of an interface effective/ineffective state judging device according to one embodiment of the present invention. This interface effective/ineffective state judging device is provided for, for example, a printer for judging whether an RS-232C interface equipped with the printer is in an effective state or in an ineffective state. The effective state means a state where data communication via the RS-232C interface can be established, and the ineffective state means a state where data communication via the RS-232C interface cannot be established.

The printer is provided with a connector 1 for the RS-232C interface. A connector 3 attached to an end of a cable 2 connected to a host computer (not shown) is fitted in the connector 1.

The connector 1 provided for the printer is provided with a data receiving pin RD to which data from the host computer is inputted. This data receiving pin RD is a pin always used in data communication between the host computer and the printer. An input signal which vibrates in the voltage range of, for example, ±12 V is applied to the data receiving pin RD. The connector 1 has, in addition to the data receiving pin RD, a sending pin for applying data to the host computer and a plurality of pins for exchanging various control signals with the host computer.

The input signal applied to the data receiving pin RD is inputted to a receiver circuit 5 for the RS-232C interface, and is binary-coded by a predetermined threshold value for binary-coding. This receiver circuit 5 is constituted by, for example, SN75189/A and SN75C189/A manufactured by Texas Instruments Incorporated or MC1489 and MC1489A manufactured by Motorola, Inc. This receiver circuit 5 has a response control terminal 5a. A voltage applied to the response control terminal 5a is changed, thereby to make it possible to change the threshold value for binary-coding in the receiver circuit 5. This receiver circuit 5 corresponds to level judging means or first level judging means and second level judging means.

A binary signal from the receiver circuit 5 is inputted from a line 6 to a microcontroller 7 for controlling the operation of the printer. A display section 8 for informing a user whether the RS-232C interface is in an effective state or in an ineffective state is connected to the microcontroller 7. This display section 8 is constituted by, for example, a liquid crystal display device or an LED (Light Emitting Diode) lamp, and is provided on the surface of the case of the printer.

A voltage Vcc (for example, 5 V) is applied to the response control terminal 5a of the receiver circuit 5 through a resistor R1 and an analog switch SW. A switching control signal is applied to the analog switch SW from the microcontroller 7 through a line 10. Specifically, on/off control of the analog switch SW is carried out by the microcontroller 7, so that the threshold value for binary-coding in the receiver circuit 5 is changed into two types. The microcontroller 7 and the analog switch SW thus constitute threshold value switching means.

Figure 2:
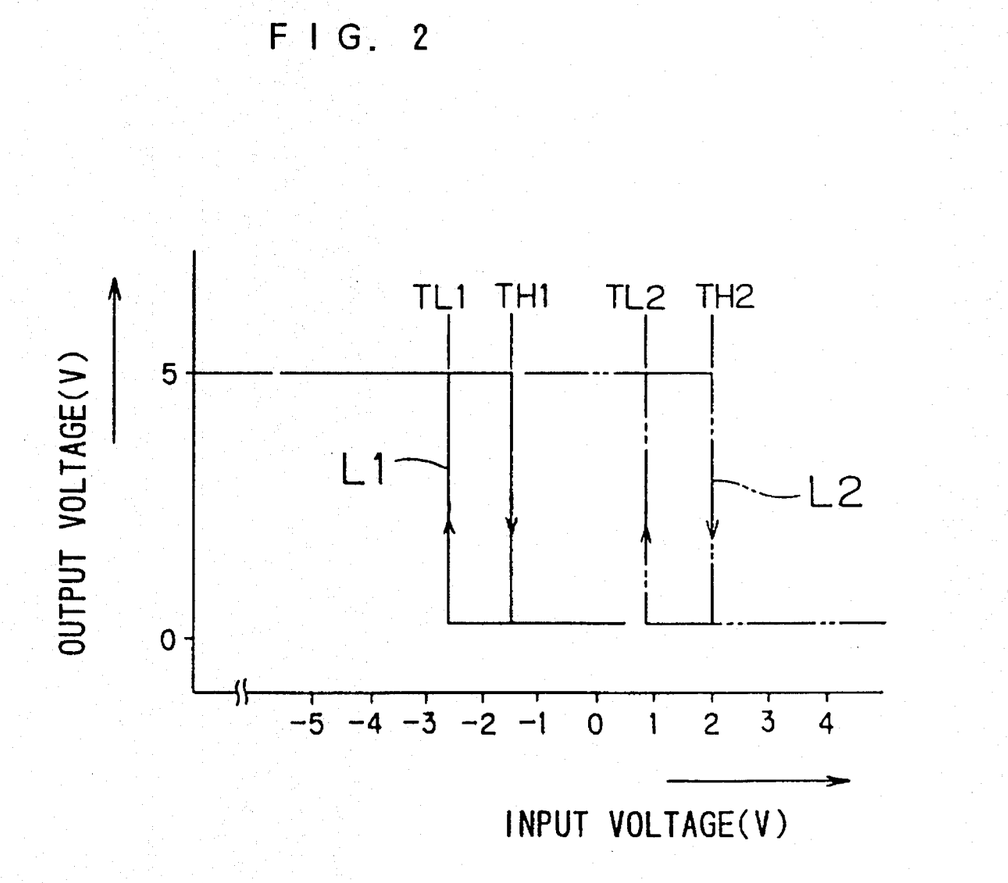
FIG. 2 is a diagram showing input-output characteristics of a receiver circuit.

FIG. 2 is a diagram showing the characteristics of the receiver circuit 5, which shows the change in the output voltage with the input voltage. The receiver circuit 5 outputs a binary signal, that is, a low-level signal of approximately 0 V and a high-level signal of approximately 5 V. In a state where the analog switch SW is rendered conductive so that the voltage Vcc is applied to the response control terminal 5a through the resistor R1, the receiver circuit 5 operates in accordance with characteristics conforming to a curve L1. On the other hand, in a state where the analog switch SW is disconnected, the receiver circuit 5 operates in accordance with characteristics conforming to a curve L2.

The case of the curve L1 is taken as an example. If the input voltage is increased, the output voltage is reversed from a high level to a low level at a threshold value TH1. On the other hand, if the input voltage is decreased, the output voltage is reversed from a low level to a high level at a threshold value TL1. Specifically, the change in the output voltage displays certain hysteresis with respect to the change in the input voltage. The same is true for the case of the curve L2. Specifically, the output voltage is reversed at a threshold value TH2 with respect to the increase in the input voltage, while being reversed at a threshold value TL2 with respect to the decrease in the input voltage. In the present embodiment, the threshold values TL1 and TH1 corresponding to the curve L1 correspond to a first threshold value, and the threshold values TL2 and TH2 corresponding to the curve L2 correspond to a second threshold value.

The signal inputted to the data receiving pin RD is a signal which is changed between +12 V and −12 V as described above. +12 V corresponds to a high level, and −12 V corresponds to a low level. As apparent from FIG. 2, whether the receiver circuit 5 operates in accordance with the characteristics conforming to the curve L1 or the characteristics conforming to the curve L2, therefore, the receiver circuit 5 can output the binary signal corresponding to received data.

Consequently, it is when no voltage is applied to the data receiving pin RD from the host computer that the output signal of the receiver circuit 5 is changed by switching the analog switch SW. Specifically, examples are a case where the connection between the connectors 1 and 3 is interrupted, and a case where the power supply of the host is shut off. In such a case, the voltage applied to the data receiving pin RD becomes 0 V. Therefore, the output signal of the receiver circuit 5 is changed between a high level and a low level by switching the analog switch SW.

Figure 3:
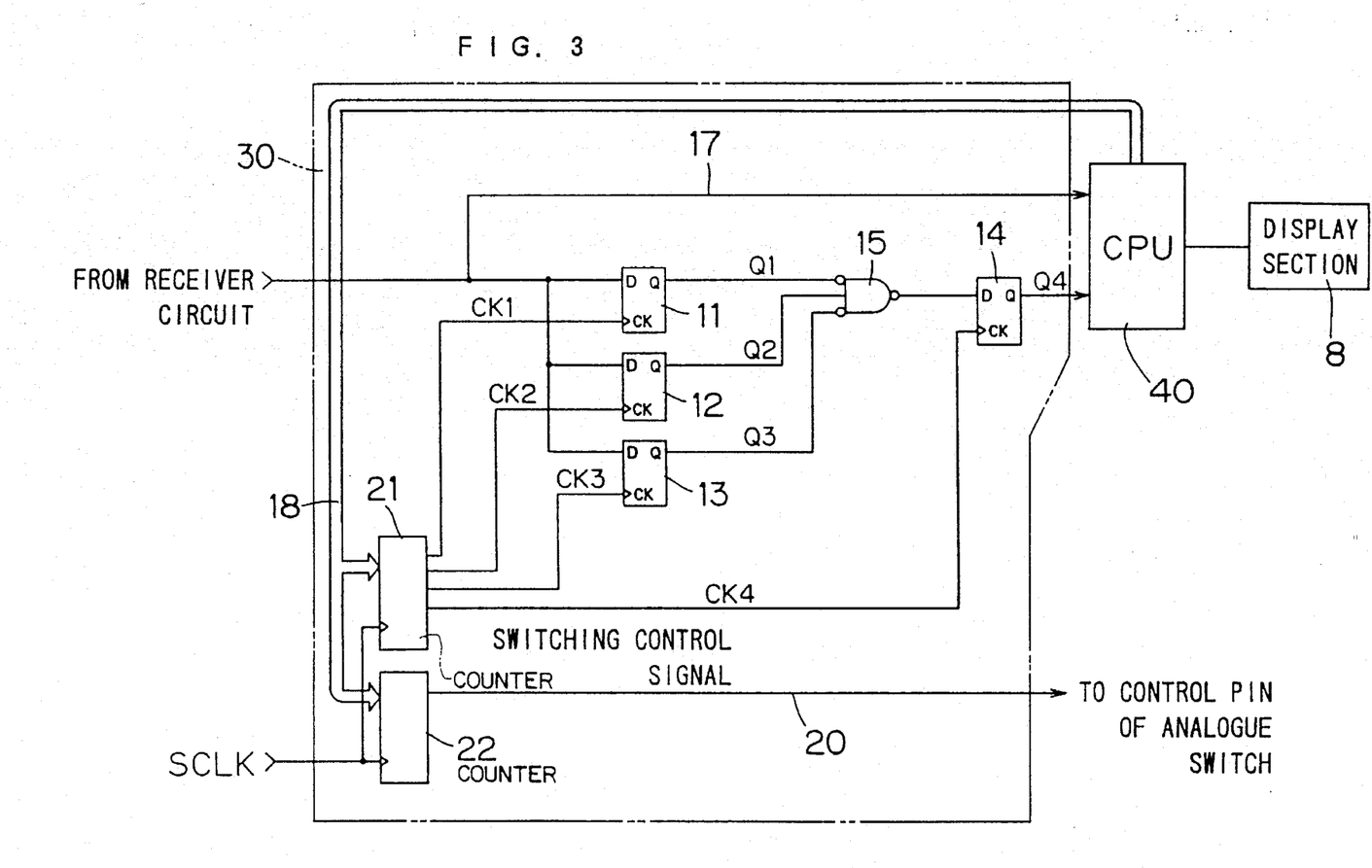
FIG. 3 is a block diagram showing the structure of a judging circuit for judging whether an interface is in an effective state or in an ineffective state.

FIG. 3 is a block diagram showing the structure of a judging circuit 30 for judging whether the RS-232C interface is in an effective state or in an ineffective state. This judging circuit 30 is provided inside the microcontroller 7. An output signal of the receiver circuit 5 is applied to a CPU (Central Processing Unit) 40 inside the microcontroller 7 as a received data signal through a line 17, and is inputted in parallel to respective data input terminals of D-type flip-flops 11, 12 and 13. Clock signals CK1, CK2 and CK3 are respectively applied to respective clock input terminals of the flip-flops 11, 12 and 13 from a counter 21. The flip-flops 11, 12 and 13 latch the output signal of the receiver circuit 5 in synchronization with the rise of the clock signals CK1, CK2 and CK3. The flip-flops 11, 12 and 13 correspond to sampling means.

Output signals Q1, Q2 and Q3 of the flip-flops 11, 12 and 13 are applied in parallel to a three-input NAND gate 15. The three-input NAND gate 15 outputs a low-level signal when the outputs of the flip-flops 11 and 13 are at a low level and the output of the flip-flop 12 is at a high level. An output signal of the NAND gate 15 is latched to a flip-flop 14 in synchronization with the rise of a clock signal CK4 applied from the counter 21. An output signal Q4 of the flip-flop 14 becomes a signal indicating whether the RS-232C interface is in an effective state or in an ineffective state and is applied to the CPU 40. Specifically, the interface is in the effective state if the output signal Q4 is at a high level, while being in the ineffective state if the output signal Q4 is at a low level.

Data for determining the periods and the pulse widths of the clock signals CK1 to CK4 is applied to the counter 21 from the CPU 40 through a data bus 18. Consequently, the counter 21 performs a counting operation in accordance with a system clock SCLK, and applies to the flip-flops 11, 12, 13 and 14 the clock signals CK1, CK2, CK3 and CK4 which circularly rise with the counting operation.

The judging circuit 30 also comprises another counter 22. This counter 22 performs a counting operation in accordance with the system clock SCLK, and outputs to a line 20 a switching control signal for carrying out on/off control of the analog switch SW. Data for defining the period and the pulse width of the switching control signal is applied to the counter 22 from the CPU 40 through the data bus 18.

Figure 4:
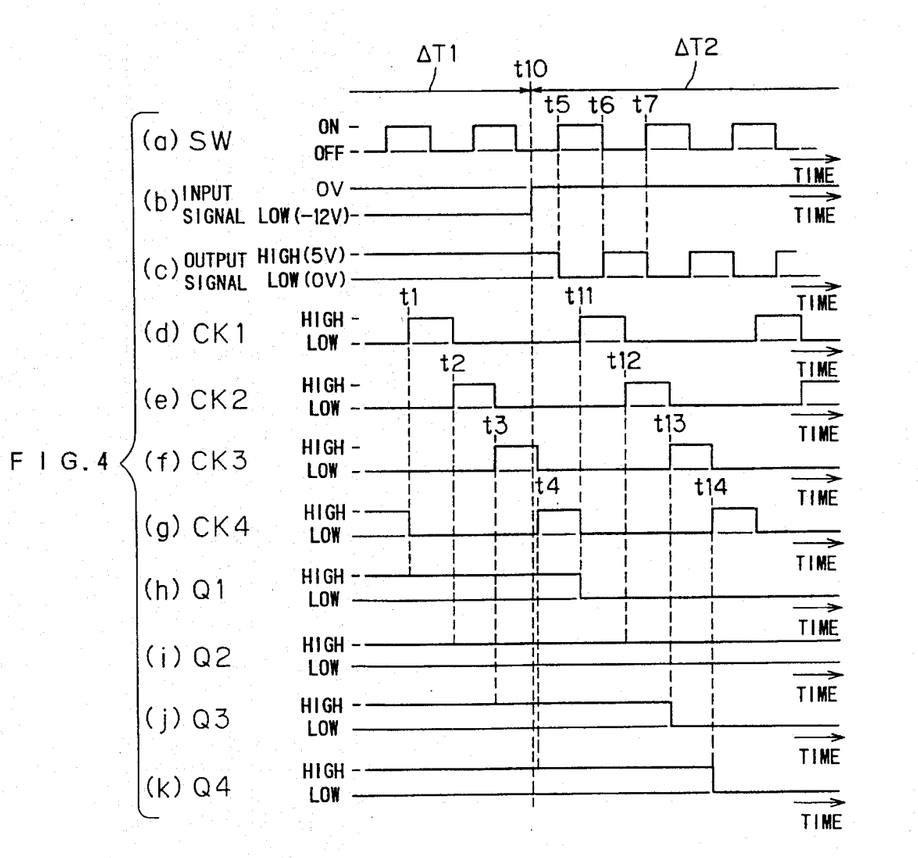

FIG. 4 is a timing chart for explaining the operation of the judging circuit 30 shown in FIG. 3. FIG. 4 (a) shows the state of the analog switch SW which is switched by the switching control signal outputted to the line 20, FIG. 4 (b) shows the input signal of the receiver circuit 5, and FIG. 4 (c) shows the output signal of the receiver circuit 5. In addition, FIGS. 4 (d), 4 (e), 4 (f) and 4 (g) respectively show the clock signals CK1, CK2, CK3 and CK4 applied to the clock input terminals of the flip-flops 11, 12, 13 and 14. Furthermore, FIGS. 4 (h), 4 (i), 4 (j) and 4 (k) respectively show the output signals Q1, Q2, Q3 and Q4 of the flip-flops 11, 12, 13 and 14.

The switching control signal which is switched in a sufficiently short period with respect to the change in the input signal to the data receiving pin RD is outputted from the counter 22. Therefore, the analog switch SW is alternately switched between a conductive state and a disconnected state at sufficiently high speed. As described in the foregoing, the characteristics of the receiver circuit 5 are switched between the characteristics conforming to the curve L1 shown in FIG. 2 and the characteristics conforming to the curve L2 in FIG. 2 depending on whether the analog switch SW is turned on or off.

On the other hand, the clock signals CK1, CK2, CK3 and CK4 which rise at timing between the times when the analog switch SW is switched are outputted from the counter 21. The clock signals CK1, CK2, CK3 and CK4 are signals having a period which is twice that of the switching control signal outputted from the counter 22 and circularly rising at timing shifted by time corresponding to a quarter period.

For example, suppose the connection between the connectors 1 and 3 is interrupted at the time t10. Specifically, a period Δ T1 before the time t10 is a period during which the interface is in an effective state where data communication can be established, and a period Δ T2 after the time t10 is a period during which the interface is in an ineffective state where data communication cannot be established. In addition, suppose the input signal to the receiving circuit 5 is at a low level (−12 V) in the period before the time t10. The receiver circuit 5 reverses the logic of the input signal. When the input signal is at a low level, therefore, the output signal attains a high level.

If the clock signal CK1 rises at the time t1, the high-level signal outputted from the receiver circuit 5 at this time is latched to the flip-flop 11, and the output signal Q1 of the flip-flop 11 attains a high level (in the case shown in FIG. 4, the output signal Q1 is at a high level before the time t1 and consequently, the state is held). Similarly, if the clock signals CK2 and CK3 respectively rise at the times t2 and t3, the high-level signal outputted from the receiver circuit 5 is latched to the flip-flops 12 and 13.

At this time, the output signal of the NAND gate 15 attains a high level. If the clock signal CK4 rises at the time t4, therefore, the output signal Q4 of the flip-flop 14 attains a high level.

At the time t10 when the connection between the connectors 1 and 3 is interrupted, the input signal to the receiver circuit 5 rises from −12 V to 0 V (see FIG. 4 (b)). Since the analog switch SW is disconnected at the time t10, the receiver circuit 5 operates in accordance with the characteristics conforming to the curve L2 shown in FIG. 2. Therefore, the output signal at a high level (5 V) is outputted from the receiver circuit 5 with respect to the input signal of 0 V.

When the analog switch SW is rendered conductive at the time t5, the receiver circuit 5 operates in accordance with the characteristics conforming to the curve L1 shown in FIG. 2. Therefore, the output signal of the receiver circuit 5 attains a low level with respect to the input signal of 0 V in a period after the time t5.

In an ineffective state where data communication cannot be established because the connection between the connectors 1 and 3 is thus interrupted, the voltage of the input signal to the data receiving pin RD becomes 0 V. In this state, if the analog switch SW is turned on and off to switch the characteristics of the receiver circuit 5 between the curves L1 and L2 shown in FIG. 2, the output signal of the receiver circuit 5 is switched between a high level and a low level.

If the clock signal CK1 rises at the time t11 in a period during which the analog switch SW is rendered conductive, the low-level signal outputted from the receiver circuit 5 is latched to the flip-flop 11. At the time t6, the analog switch SW is disconnected, so that the output signal of the receiver circuit 5 attains a high level. When the clock signal CK2 rises at the time t12 after the time t6, the high-level signal outputted from the receiver circuit 5 is latched to the flip-flop 12. In addition, the analog switch SW is rendered conductive again at the time t7, so that the output signal of the receiver circuit 5 attains a low level. This low-level signal is latched to the flip-flop 13 by the rise of the clock signal CK3 at the time t13.

Consequently, the output signal of the NAND gate 15 attains a low level in a period after the time t13. The low-level signal outputted from the NAND gate 15 is latched to the flip-flop 14 in synchronization with the rise of the clock signal CK4 at the time t14. As a result, in a period after the time t14, the output signal Q4 of the flip-flop 14 attains a low level. The low-level signal is inputted to the CPU 40 as an ineffective state detecting signal.

The CPU 40 which receives the ineffective state detecting signal controls the display section 8 to indicate that the RS232C interface is in the ineffective state.

Figure 5:
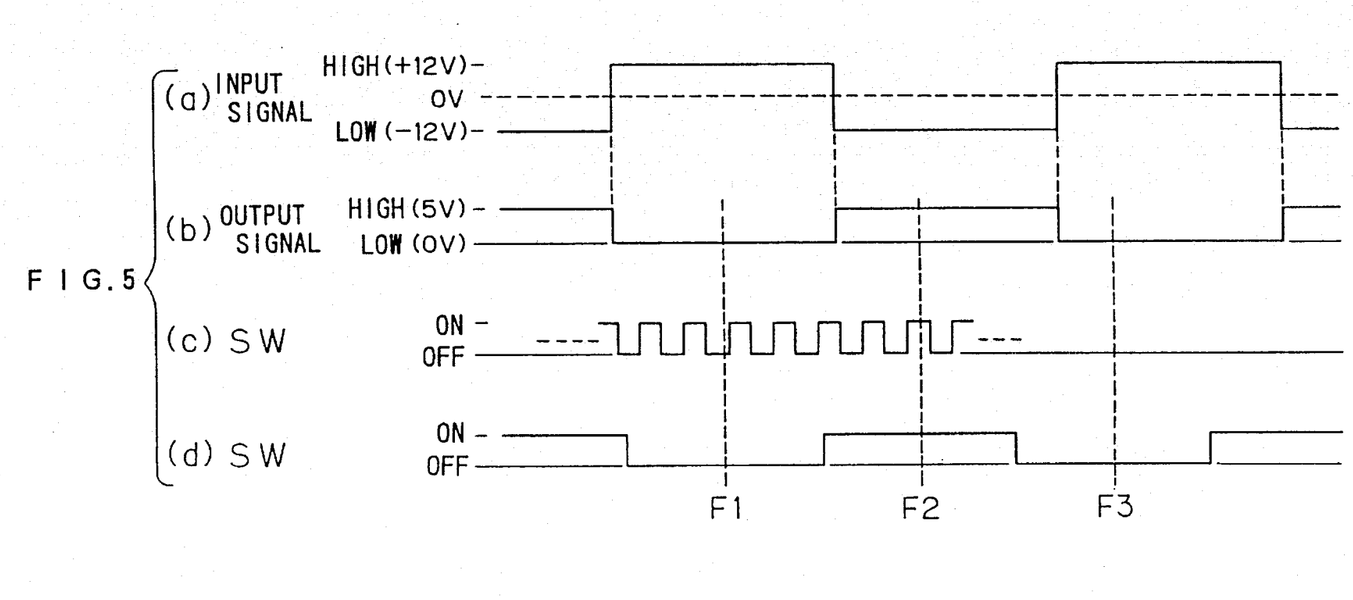

FIG. 5 is a timing chart showing the relationship between the input signal applied to the receiver circuit 5 through the data receiving pin RD and on/off control of the analog switch SW. FIG. 5 (a) shows the input signal, FIG. 5 (b) shows the output signal of the receiver circuit 5, and FIGS. 5 (c) and 5 (d) show on/off timing of the analog switch SW. FIG. 5 (c) shows the operation timing of the analog switch SW in a case where it is sufficiently judged whether the interface is in an effective state or in an ineffective state, and FIG. 5 (d) shows the operation timing of the analog switch SW in a case where it is insufficiently judged whether the interface is in an effective state or in an ineffective state. The analog switch SW actually operates in accordance with the timing shown in FIG. 5 (c).

As described in the foregoing, the signal obtained by reversing the logic of received data is outputted from the receiver circuit 5 irrespective of the switching of the analog switch SW.

The judgment whether the interface is in an effective state or in an ineffective state in the judging circuit 30 shown in FIG. 3 is made by monitoring the output signal of the receiver circuit 5 to determine whether the output signal is changed in the order of a low level, a high level and a low level when the analog switch SW is switched. The output signal of the receiver circuit 5 is sampled (the signal is latched to the flip-flops 11, 12 and 13) at timing between the times when the analog switch SW is switched.

If the analog switch SW is switched in a period which is approximately the period of the input signal, as shown in FIG. 5 (d), the output signal of the receiver circuit 5 at the times F1, F2 and F3 is sampled. Since the sampled output signal of the receiver circuit 5 is changed in the order of a low level, a high level and a low level, the output of the NAND gate 15 in the judging circuit 30 attains a low level. This low-level signal is latched to the flip-flop 14, whereby the ineffective state detecting signal is applied to the CPU 40. Specifically, it is erroneously judged that the interface is in the ineffective state irrespective of the fact that the interface is in the effective state where the input signal vibrates in the range of ±12 V.

Such a problem is solved by switching the analog switch SW at sufficiently high speed with respect to the change in the input signal, as shown in FIG. 5 (c). Specifically, the analog switch SW may be switched in a period which is less than one-half (preferably, approximately one-tenth) the period of the input signal.

As described in the foregoing, according to the present embodiment, the input voltage to the response control terminal 5a of the receiver circuit 5 used in the RS-232C interface is controlled by switching the analog switch SW. Consequently, the threshold value for binary-coding in the receiver circuit 5 is changed into two types. The output signal of the receiver circuit 5 at timing before and after the time when the threshold value for binary-coding is changed is monitored. It is judged whether the RS-232C interface is in an effective state or in an ineffective state on the basis of the result of the monitoring.

If the interface is in the ineffective state as in a case where the connection between the connectors 1 and 3 is interrupted, the voltage of the signal inputted to the receiver circuit 5 from the data receiving pin RD is 0 V. The threshold value for binary-coding in the receiver circuit 5 is switched between values higher and lower than 0 V. When the output signal of the receiver circuit 5 is changed before and after the threshold value for binary-coding is switched, it is judged that the interface is in the ineffective state.

However, the threshold value for binary-coding in the receiver circuit 5 is changed in the amplitude range of the input signal inputted to the data receiving pin RD from the host computer. If the interface is in the effective state, therefore, a correct signal corresponding to the input signal is outputted from the receiver circuit 5 irrespective of whether the analog switch SW is turned on or off.

In the above described manner, according to the present embodiment, a structure for judging whether the RS-232C interface is in an effective state or in an ineffective state can be provided for the printer, and the result of the judgment is displayed on the display section 8. If the interface is in the ineffective state, therefore, it is possible to inform the user that the interface is in the ineffective state. As a result, the possibility that data is uselessly sent from the host computer to the printer irrespective of the fact that the interface is in the ineffective state is eliminated, thereby to make it possible to prevent meaningless waiting time.

Moreover, in the present embodiment, it is noted that the threshold value for binary-coding in the receiver circuit 5 for the RS-232C interface used for receiving data can be controlled from outside, to adopt a structure in which the control voltage applied to the response control terminal 5a is switched by the analog switch SW. Therefore, it is possible to judge whether the interface is in an effective state or in an ineffective state by a relatively simple structure.

Although description was made of the embodiment of the present invention, the present invention is not limited to the above described embodiment. For example, in the above described embodiment, the analog switch SW is switched and the output of the receiver circuit 5 is sampled three times, and it is judged whether the interface is in an effective state or in an ineffective state on the basis of the result of the sampling repeated three times. If the output signal of the receiver circuit 5 is changed as the analog switch SW is switched, however, it can be judged that the interface is in an ineffective state. Accordingly, the number of times of sampling may be at least two. It goes without saying that it may be judged whether the interface is in an effective state or in an ineffective state on the basis of the result of sampling repeated not less than four times. In order to accurately make the judgment, it is preferable that the number of times of sampling is not less than three.

Furthermore, although in the above described embodiment, the input signal from the data receiving pin RD is monitored, an input signal from the other pin may be monitored to judge whether the interface is in an effective state or in an ineffective state. In this case, there may be provided, in addition to the receiver circuit 5 for data receiving, level judging means capable of switching a threshold value to at least two types and setting the same as in the receiver circuit 5.

Furthermore, although in the above described embodiment, it is judged whether the interface is in an effective state or in an ineffective state by the hardware structure shown in FIG. 3, such judgment may be made by software processing performed by the microcontroller 7.

Additionally, although in the above described embodiment, it is judged whether the RS-232C interface is in an effective state or in an ineffective state, the present invention can be also used for judging whether a Centronics interface is in an effective state or in an ineffective state.

Although the present invention has been described and illustrated in detail, it is clearly understood that the same is by way of illustration and example only and is not to be taken by way of limitation, the spirit and scope of the present invention being limited only by the terms of the appended claims.

The disclosure of Japanese Patent Application Serial No. 274442/1992, filed Oct. 13, 1992, is incorporated herein by reference.

What is claimed is:

1. An interface effective/ineffective state judging device for judging whether or not a predetermined interface is in an effective state where data communication via said interface can be effectively established or in an ineffective state where data communication via said interface cannot be effectively established, comprising:

level judging means for judging whether an input signal externally inputted to said predetermined interface is higher or lower than a predetermined threshold value to output a signal corresponding to the result of the judgment and capable of changing said threshold value;

threshold value switching means for switching the threshold value in said level judging means between a first threshold value higher than said input signal in a case where the interface is in said ineffective state and a second threshold value lower than said input signal in a case where the interface is in said ineffective state within an amplitude range of said input signal; and judging means for monitoring the output signal of said level judging means before and after the switching of said threshold value by said threshold value switching means to judge that said interface is in the ineffective state when the output signal of said level judging means is changed by the switching of said threshold value, while judging that said interface is in the effective state when the output signal of said level judging means is not changed even by the switching of said threshold value.

2. An interface effective/ineffective state judging device according to claim 1, wherein said threshold value switching means switches the threshold value in said level judging means between said first threshold value and said second threshold value at sufficiently short time intervals with respect to a change in time of said input signal.

3. An interface effective/ineffective state judging device according to claim 2, wherein said threshold value switching means switches the threshold value in said level judging means in a period which is less than one-half a period of the change in time of said input signal.

4. An interface effective/ineffective state judging device according to claim 1, wherein said input signal is a signal corresponding to data.

5. An interface effective/ineffective state judging device according to claim 4, wherein said level judging means is a receiver circuit for generating binary data corresponding to said input signal.

6. An interface effective/ineffective state judging device according to claim 1, wherein said judging means comprises sampling means for sampling the output signal of said level judging means at timing between the times when the threshold value in said level judging means is switched by said threshold value switching means and means for judging whether the interface is in the effective state or in the ineffective state on the basis of result of the sampling continuously repeated not less than three times in said sampling means.

7. An interface effective/ineffective state judging device according to claim 1, further comprising reporting means for reporting, when said judging means judges that said predetermined interface is in the ineffective state, that said predetermined interface is in the ineffective state.

8. An interface effective/ineffective state judging device for judging whether a predetermined interface is in an effective state where data communication via said interface can be effectively established or in an ineffective state where data communication via said interface cannot be effectively established, comprising:

first level judging means for judging whether an input signal externally inputted to said predetermined interface is higher or lower than a first threshold value which is a value within an amplitude range of said input signal and is higher than said input signal in a case where the interface is in said ineffective state;

second level judging means for judging whether the input signal is higher or lower than a second threshold value which is a value within the amplitude range of said input signal and is lower than said input signal in a case where the interface is in said ineffective state;

means for judging that said interface is in the ineffective state when it is judged that said input signal is lower than said first threshold value and it is judged that said input signal is higher than said second threshold value;

means for judging that said interface is in the effective state when it is judged that said input signal is higher than both said first threshold value and said second threshold value; and means for judging that said interface is in the effective state when it is judged that said input signal is lower than both said first threshold value and said second threshold value.

9. An interface effective/ineffective state judging device according to claim 8, wherein the judgment in said first level judging means and the judgment in said second level judging means are alternately made.

10. An interface effective/ineffective state judging device according to claim 9, wherein the judgment in said first level judging means and the judgment in said second level judging means are alternately made at sufficiently short time intervals with respect to a change in time of said input signal.

11. An interface effective/ineffective state judging device according to claim 9, wherein the judgment in said first level judging means and the judgment in said second level judging means are alternately made in a period which is less than one-half a period of a change in time of said input signal.

12. An interface effective/ineffective state judging device according to claim 8, wherein said input signal is a signal corresponding to data.

13. An interface effective/ineffective state judging device according to claim 12, wherein each of said first level judging means and said second level judging means is constituted by one receiver circuit capable of generating binary data corresponding to said input signal and setting a threshold value for binary-coding to at least two types.

14. An interface effective/ineffective state judging device according to claim 8, further comprising reporting means for reporting, when it is judged that said predetermined interface is in the ineffective state, that said predetermined interface is in the ineffective state.

15. An interface effective/ineffective state judging method in which it is judged whether or not a predetermined interface is in an effective state where data communication via said interface can be effectively established or in an ineffective state where data communication via said interface cannot be effectively established, comprising the steps of:

judging whether an input signal externally inputted to said predetermined interface is higher or lower than a first threshold value which is a value within an amplitude range of said input signal and is higher than said input signal in a case where the interface is in said ineffective state;

judging whether the input signal is higher or lower than a second threshold value which is a value within the amplitude range of said input signal and is lower than said input signal in a case where the interface is in said ineffective state;

judging that said interface is in the ineffective state when it is judged that said input signal is lower than said first threshold value and it is judged that said input signal is higher than said second threshold value;

judging that said interface is in the effective state when it is judged that said input signal is higher than both said first threshold value and said second threshold value; and judging that said interface is in the effective state when it is judged that said input signal is lower than both said first threshold value and said second threshold value.

16. An interface effective/ineffective state judging method according to claim 15, wherein the judgment whether said input signal is higher or lower than said first threshold value and the judgment whether said input signal is higher or lower than said second threshold value are alternately made.

17. An interface effective/ineffective state judging method according to claim 16, wherein the judgment whether said input signal is higher or lower than said first threshold value and the judgment whether said input signal is higher or lower than said second threshold value are alternately made at sufficiently short time intervals with respect to a change in time of said input signal.

18. An interface effective/ineffective state judging method according to claim 16, wherein the judgment whether said input signal is higher or lower than said first threshold value and the judgment whether said input signal is higher or lower than said second threshold value are alternately made in a period which is less than one-half a period of a change in time of said input signal.

19. An interface effective/ineffective state judging method according to claim 15, wherein said input signal is a signal corresponding to data.

* * * * *